United States Patent [19]

Fair

[11] Patent Number: 4,979,545

[45] Date of Patent: Dec. 25, 1990

[54] BUBBLER CONTAINER AUTOMATIC REFILL SYSTEM

[75] Inventor: David L. Fair, Rockford, Ill.

[73] Assignee: Olin Corporation, Cheshire, Conn.

[21] Appl. No.: 561,495

[22] Filed: Jul. 31, 1990

Related U.S. Application Data

[63] Continuation of Ser. No. 265,387, Oct. 31, 1988, abandoned, which is a continuation-in-part of Ser. No. 116,933, Nov. 4, 1987, abandoned.

[51] Int. Cl.$^5$ ............................................. B67D 5/54
[52] U.S. Cl. ..................................... 141/083; 141/94; 141/198; 222/64; 261/DIG. 65; 137/386
[58] Field of Search ................ 141/197, 198, 302, 83, 141/94, 95; 137/386; 222/64, 65, 400.7; 261/DIG. 65

[56] References Cited

U.S. PATENT DOCUMENTS

| | | | |
|---|---|---|---|
| 3,605,824 | 9/1971 | Madden et al. | 141/1 |
| 3,812,890 | 5/1974 | Haas et al. | 141/94 |
| 4,121,633 | 10/1978 | Diez | 141/69 |
| 4,235,829 | 11/1980 | Partus | 261/121.1 |
| 4,298,037 | 11/1981 | Schumacher et al. | 141/1 |
| 4,393,013 | 7/1983 | McMenamin | 261/64 B |
| 4,408,640 | 10/1983 | Voza | 141/1 |
| 4,436,674 | 3/1984 | McMenamin | 261/64 B |
| 4,467,844 | 8/1984 | Di Gianfilippo et al. | 141/1 |
| 4,545,801 | 10/1985 | Miyajiri et al. | 137/211 |
| 4,582,480 | 4/1986 | Lynch et al. | 432/1 |
| 4,598,742 | 7/1986 | Taylor | 141/95 |
| 4,676,404 | 6/1987 | Yamazaki et al. | 137/208 |
| 4,713,552 | 12/1987 | Denis et al. | 250/577 |
| 4,859,375 | 8/1989 | Lipisko et al. | 261/20 |

FOREIGN PATENT DOCUMENTS 0123111  7/1983  Japan ................................. 137/386

OTHER PUBLICATIONS

Operation, Instruction and Maintenance Manual—J. C. Schumacher Company—Chemical Refill Systems—CRS.

Brochure—J. C. Schumacher Company—Chemical Refill System—CRS.

*Primary Examiner*—Ernest G. Cusick
*Attorney, Agent, or Firm*—Ralph D'Alessandro

[57] ABSTRACT

An automatic refill system for a liquid chemical temperature controller is provided wherein replenishing liquid chemical is automatically supplied from a chemical bulk supply to a bubbler ampule in the liquid chemical temperature controller based on sensed level depths in a manner that avoids contamination of the replenishing chemical.

16 Claims, 5 Drawing Sheets

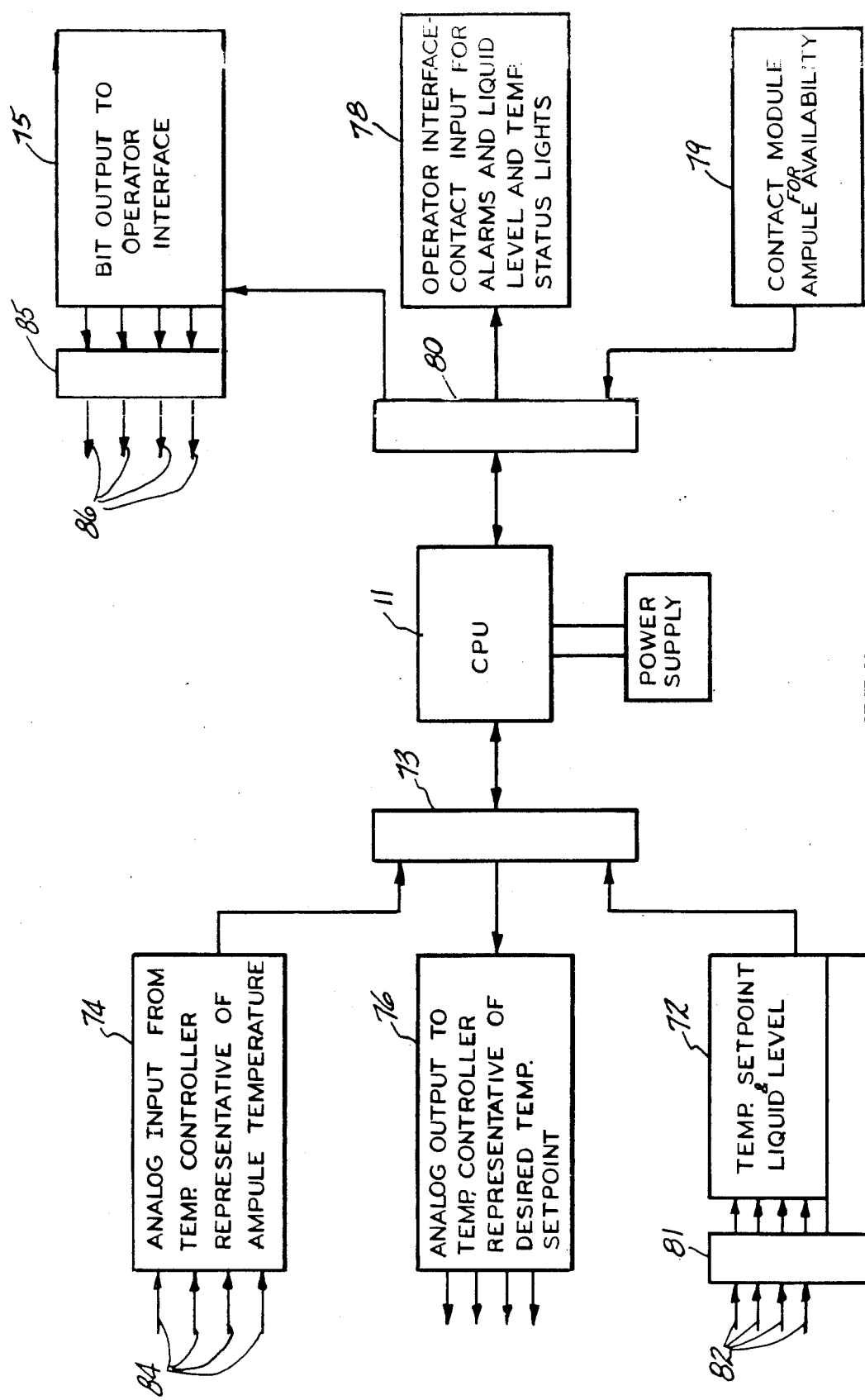

BUBBLER CONTAINER AUTOMATIC REFILL SYSTEM

This application is a continuation of application Ser. No. 265,387, filed Oct. 31, 1988, now abandoned which was a continuation-in-part of application Ser. No. 116,933, filed Nov. 4, 1987, now abandoned.

BACKGROUND OF THE INVENTION

This invention relates generally to a system to automatically refill a liquid from a bulk container to a smaller receiving container without contamination. More specifically, it relates to a system providing fresh liquid dopant chemicals through an automatic refill to a bubbler ampule in a liquid dopant temperature controller that supplies a dopant saturated carrier gas to a diffusion furnace.

Liquid dopant temperature controllers have been utilized in the semiconductor and fiber optics industries to supply dopant chemicals in carrier gases that are saturated with the dopant as a function of the bubbler ampule's, or dopant receiving container's, temperature. The dopant chemicals are ultra high purity liquid chemicals required for these industries.

The ampules in liquid temperature controllers, commonly called bubblers, must be periodically replaced based on the usage of the ultra high purity dopant chemical. The amount of dopant chemical used is a function of the degree of saturation of the carrier gas carrying the dopant chemical to the diffusion furnace and the quantity of carrier gas used. This, in turn, is a direct function of the bubbler ampule temperature. Typical inert carrier gases are nitrogen, argon, or helium. Some typical dopant chemicals utilized in bubblers are 1,1-trichloroethane (TCA), tetraethylortho-silicate (TEOS), and phosphorous oxychloride ($POCl_3$).

In the past, when the dopant chemical in the bubbler ampule was depleted, typically the ampule had to be removed from the temperature controller and refilled at a remote site. An attempt to create a commercial system to refill the ampules within the temperature controller was developed by the J. C. Schumacher Company and called the CRS chemical refill system. This system refills empty quartz bubbler ampules batchwise in the temperature controllers.

In the typical semiconductor prior art process, a replacement bubbler ampule, with fresh dopant chemical, is inserted into the liquid temperature controller. This replacement of the dopant chemical, however, requires physical removal of the depleted ampule from the liquid dopant temperature controller and suffers from the inability to operate both the diffusion furnace and the liquid dopant temperature controller for a period of time. The temperature of the replacement liquid dopant chemical is lower than that required for operation by this prior art replacement procedure. Normally the furnace tube temperature is then lowered during these periods of non-operation. Prior to recommencing use of the replenished dopant chemicals, both the bubbler ampule and the diffusion furnace have to be reheated to their operating temperatures. Further, test samples are routinely run through the process to ensure that the replenished chemical is not contaminated prior to resuming the production operation. The total liquid dopant chemical replacement process can take from two to eight hours, depending upon the chemical involved and the end use.

In the prior art Schumacher chemical refill system, the same problem was present with the low temperature of the replacement dopant chemical and resultant inability to operate the diffusion furnace until the chemical was reheated. This system had the additional disadvantage of being oversized for use in clean rooms.

Automatic liquid replacement or refill systems for liquids have been utilized in other industries generally where the purity requirements are far less stringent. Generally, however, these replacement systems have been based upon measuring the weight and the receiving container at comparative points in time or by using a time filling sequence to ensure the proper volumetric quantity is delivered. None of the systems were designed to work with the stringent requirements needed for ultra high purity chemicals in the semiconductor industry.

These problems are solved in the design of the present automatic refill system to automatically refill the bubbler ampule in a liquid dopant temperature controller without removing the ampule from the controller.

SUMMARY OF THE INVENTION

It is an object of the present invention to provide an automatic refill system for an ultra high purity chemical.

It is another object of the present invention to provide an automatic refill system for an ultra high purity chemical that obviates the need to remove the receiving container from the working apparatus.

It is a feature of the present invention that the system senses the liquid chemical level in the receiving chemical container in the liquid temperature controller.

It is another feature of the present invention that the degree of saturation of the carrier gas by the dopant liquid chemical replenished by the automatic refill system does not significantly change.

It is another feature of the present invention that the liquid dopant chemical is supplied to the receiving container by a down tube that does not significantly disturb the liquid-gas interface.

It is still another feature of the present invention that the automatic refill system can be utilized to fill more than one liquid receiving receptacle with the ultra high purity chemical from a single bulk container.

It is a further feature of the present invention that the temperature of the liquid dopant chemical in the dopant chemical receiving ampule does not change significantly during replenishment and that the level change of the liquid dopant chemical is minimized.

It is yet another feature of the present invention that a sensing device warns when the ultra high purity chemical liquid level in the bulk container is getting low and needs replacement.

It is an advantage of the present invention that there is no need to remove the ultra high purity chemical liquid-receiving ampule from the liquid temperature controller to refill it with the dopant chemical, nor is there a necessity to install a new ampule in its place.

It is another advantage of the present invention that the time necessary to replenish the ultra high purity liquid dopant chemical does not interfere with the operation of the diffusion furnace.

It is still another advantage of the present invention that the time necessary to heat the replenished ultra high purity dopant chemical to its operating temperature is reduced by minimizing the level change in the dopant receiving bubbler ampule.

It is a further advantage of the present invention that the operation of the end process diffusion furnace is not interrupted by the automatic refilling of the dopant chemical receiving ampule.

It is still another advantage of the present invention that the automatic refill system does not upset the temperature of the liquid dopant chemical in the receiving ampule and, therefore, the saturation level of the exiting gas is not significantly disturbed.

These and other objects, features and advantages are obtained by an automatic refill system which senses the level of liquid dopant chemical in the bubbler ampule and automatically refills the dopant liquid chemical in the bubbler ampule to an operating level without requiring removal of the ampule from the liquid temperature controller or without significantly affecting the temperature and the saturation level of the carrier gas with the liquid dopant chemical.

BRIEF DESCRIPTION OF THE DRAWINGS

FIG. 6 is a block diagram indicating the logic circuitry flow path for the automatic refill system;

DETAILED DESCRIPTION OF THE PREFERRED EMBODIMENT

Figure 1:
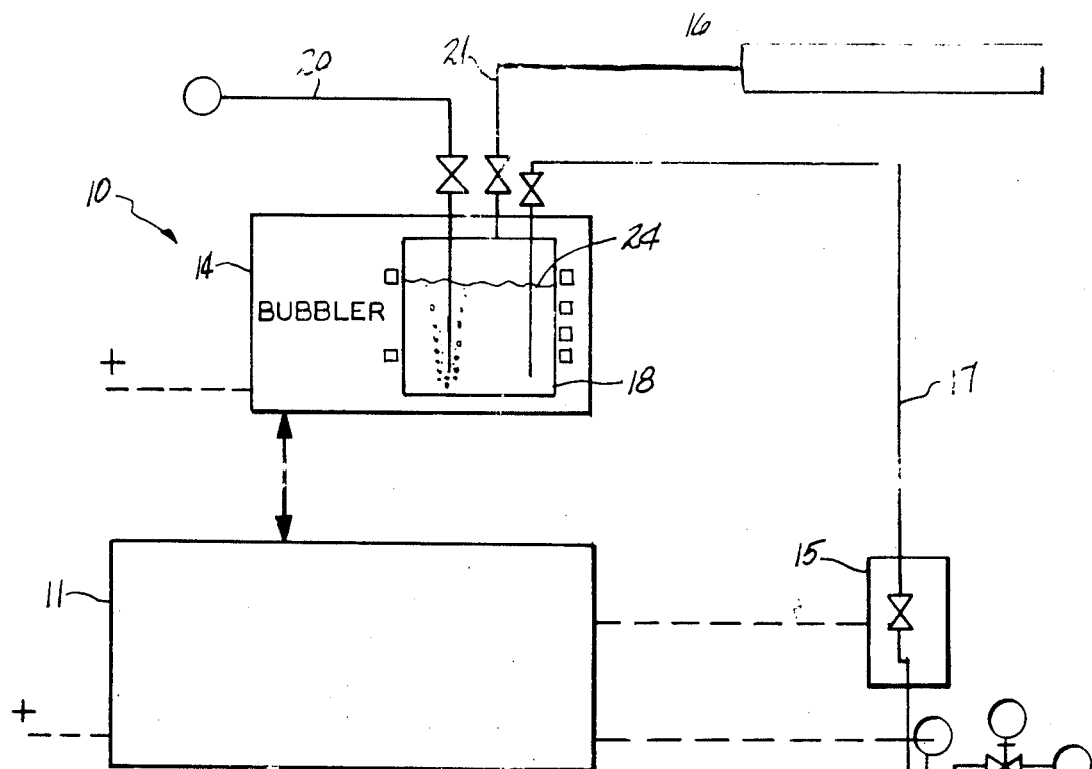
FIG. 1 is a diagrammatic illustration of the automatic refill system utilizing a liquid temperature controller, a bulk container for the liquid dopant chemical and a remote microprocessor controlling the refill.

FIG. 1 is a diagrammatic illustration of an automatic refill system for providing an ultra high purity chemical from a bulk supply chemical container to a working container as a part of a larger working apparatus. This system, indicated generally by the numeral 10, will be described in terms of a liquid dopant temperature controller, indicated generally by the numeral 14, that operates within the system and is controlled by a microprocessor or programmable controller 11 which controls the replenishment of chemical from a bulk supply chemical container or tank 12. Where multiple liquid dopant temperature controllers have their ampules 18 refilled from the single bulk supply chemical container 12, the microprocessor or programmable controller 11 is programmed to control the refilling operation of all the ampules.

In response to sensings from the controller 14 of the liquid level within ampule or working container 18, the microprocessor or programmable controller 11 calls for refill of the chemical from the bulk container 12 by actuator means, such as solenoid valves 15, to move the valves between open and closed positions.

Figure 2:
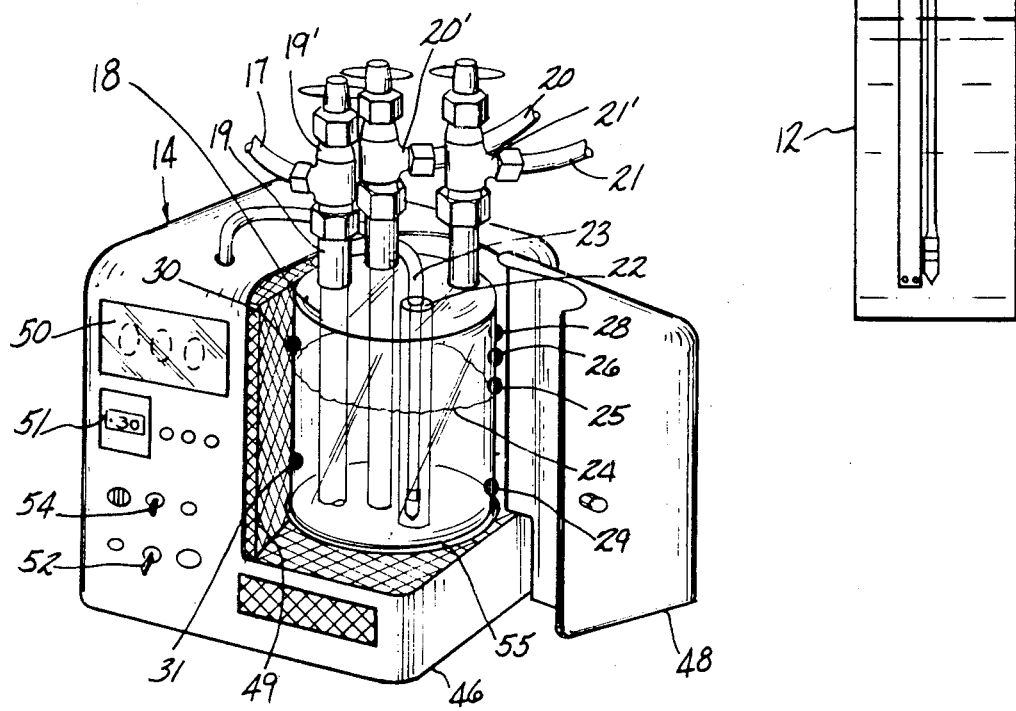
FIG. 2 is a diagrammatic illustration of the liquid temperature controller showing the liquid dopant receiving ampule.

As seen in FIG. 2, the liquid dopant temperature controller 14 is a standard controller commercially available, such as that sold by Olin Hunt as the Apache Model 775. The ampule 18 is placed within the controller 14 and is shown having an automatic refill line 19 through which the replacement chemical is added via chemical process infeed line 17, an inert carrier gas process infeed line 20, a dopant saturated gas outlet line 21 and a thermowell 22 filled with oil (not shown) and a temperature sensing unit 23 for sensing temperatures of the chemical within the ampule 18. The automatic refill line 19 is seen extending down into the ampule and below the liquid chemical gas interface level 24 to a position adjacent the bottom of the ampule. The gas liquid interface 24 is shown as being somewhere between the top and the bottom of the ampule. Couplings and shutoff valves, indicated generally by the numerals 19', 20', and 21' connect lines 17, 20 and 21 to the ampule 18.

Liquid dopant temperature controller 14 has a housing 46 with a hinged door 48 to permit access to the ampule 18. An insulating and cushioning material 49 fills the space surrounding the sides of the ampule 18, with appropriate openings for the sensor means to be described hereafter. A liquid temperature readout 50 and a temperature set point 51, along with a controller power switch 52 and alarm set switch 54 are provided on the front of the housing 46. An ampule heating means and heat sink 55 controls the temperature of the liquid dopant chemical within the controller 14.

Sensor means are provided within the temperature controller 14 to sense the level of the liquid chemical and to automatically refill the ampule 18 to attempt to obtain the minimum level of liquid dopant chemical change possible. This ensures that the temperature of the chemical is not substantially disturbed when refilled with room temperature chemical from the bulk container 12 and that the degree of saturation of the carrier gas with the dopant chemical is not significantly altered. The sensor means include an automatic fill start point chemical level sensor means 25 and an automatic fill stop point chemical level sensor means 26, both of which are preferably about one centimeter apart in vertical height. The controller 14 also has a chemical level overfill automatic shutoff point sensor means 28 in the event that the liquid level exceeds the level of the stop point chemical level of sensor means 26. A low level sensor means 29 can make an emergency call for resupply of chemical from the bulk supply chemical container 12 and initiates a signal by an appropriate alarm, such as visual or audial, should the chemical level drop to an unacceptably low level in the ampule 18 that could cause an interruption of operation if not corrected.

The sensor means 25, 26 and 28 work in conjunction with a light source or infrared emitter 30, such as a light emitting diode, that is positioned oppositely in the wall of the controller 14 from the sensor means 25, 26 and 28. Sensor means 25, 26 and 28 are appropriate commercially available photoreceptors or photodarlingtons, depending upon the sensitivity required.

Low level sensor means 29 also is a commercially available photoreceptor or photodarlington that works in conjunction with a light source or infrared emitter 31 near the bottom of the ampule 18 to detect when the dopant chemical is at a dangerously low level. Sensor means 29 can also be employed in conjunction with additional photoreceptors to detect, for example, when the dopant chemical level is at 2 centimeters depth, 1 centimeter depth and then empty, based on light emitted from infrared emitter 31.

The position of the automatic refill line 19 permits the replacement dopant chemical to enter the ampule 18 adjacent the bottom of the ampule at a point closest to the heating means and heat sink 55 on which the ampule 18 sits for warming the replacement dopant chemical quickly to the required temperature to preserve the required degree of carrier gas saturation by the dopant chemical, as previously mentioned. The key in this process is the positioning of the automatic fill start point and stop point chemical level sensor means 25 and 26 so that only a relatively small volume of replacement dopant chemical enters the ampule at one time. This permits the dopant chemical to be continuously available so that the end process apparatus, for example the diffusion furnace 16 of FIG. 1, is constantly supplied with dopant chemical saturated gas and can operate continuously.

Figure 3:
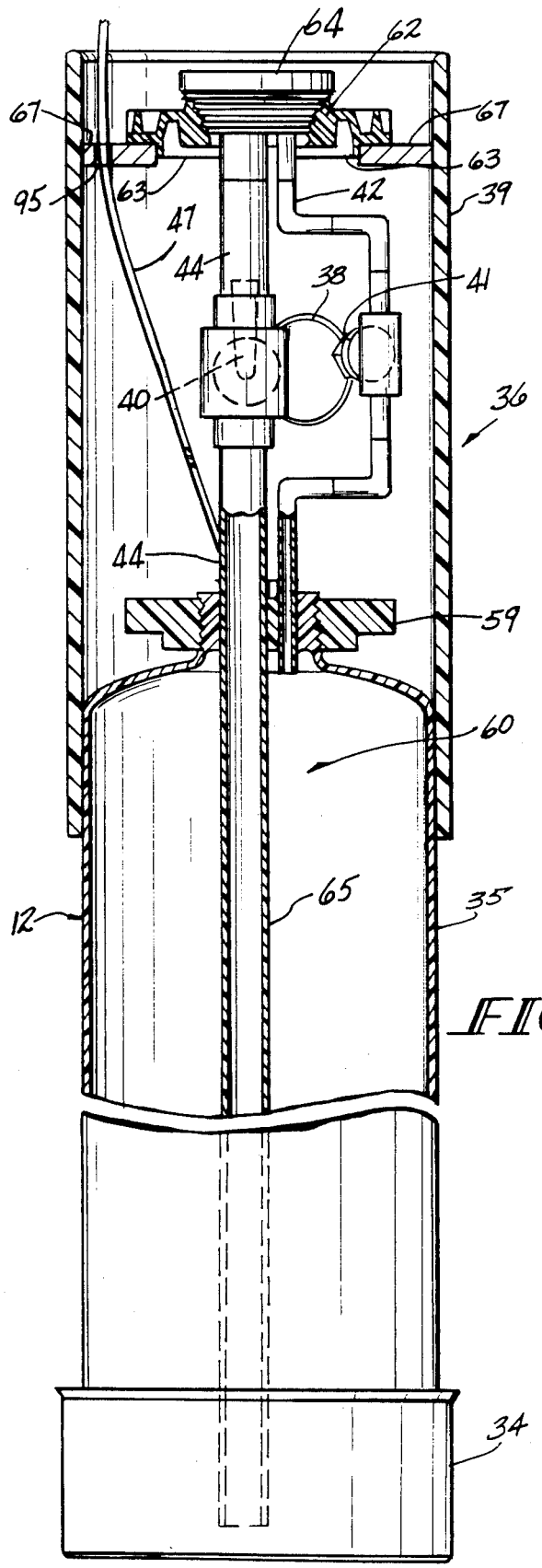
FIG. 3 is a side elevational view of the bulk container that provides the liquid dopant chemical to the liquid dopant receiving ampule.

FIG. 3 shows the bulk supply dopant chemical container 12 with a base section 34 to support the bottle container 33, a sidewall 35 that is preferably polytetrafluoroethylene, such as DuPont's TEFLON ® PFA or at least lined with this material, and a top bulk supply container connection apparatus or section, indicated generally by the numeral 36. The bottle container 33 is overwrapped with fiberglass rovings soaked in epoxy resin. An access port 38 is provided in the cap 39 of top section 36 to permit access to the valves 40 and 41. Valve 41 controls the flow of the inert gas, such as nitrogen, that is released into the container 12 through supply line 42 from a gas process supply line (not shown) to pressurize the system. This forces out the dopant chemical into the liquid dopant chemical output supply line 44 the liquid dopant chemical infeed line 17 of FIGS. 1 and 8 when the valve 40 is open. The inert gas supply line 42 is offset in an appropriate manner to permit both valves 40 and 41 to be reached through the access port 38.

Figure 5:
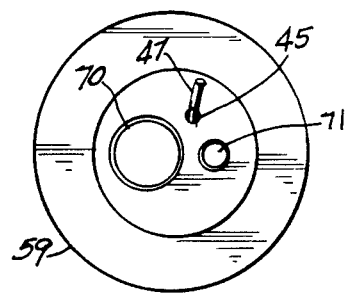
FIG. 5 is a top plan view of the top of the dip tube assembly as it fits in the bulk container showing the openings for the chemical, air and electrical lines.

The container 12, as seen in FIG. 3, has top closure 59 threaded into the top of bottle container 33 as part of the dip tube assembly, indicated generally by the numeral 60. Top closure 59, as seen briefly in FIG. 5, has three openings. Opening 70 is for the liquid dopant chemical flow conduit or supply line 44, opening 71 is for the inert gas supply line 42 and conduit 45 holds the electronic wiring 47 (also seen in FIG. 4) for the depth sensor means 61 of FIG. 4. Conduit 45, located behind the liquid dopant chemical supply line 44 in FIG. 3. Supply line 44 and inert gas supply line 42 are made of DuPont's TEFLON ® PFA plastic.

Figure 8:
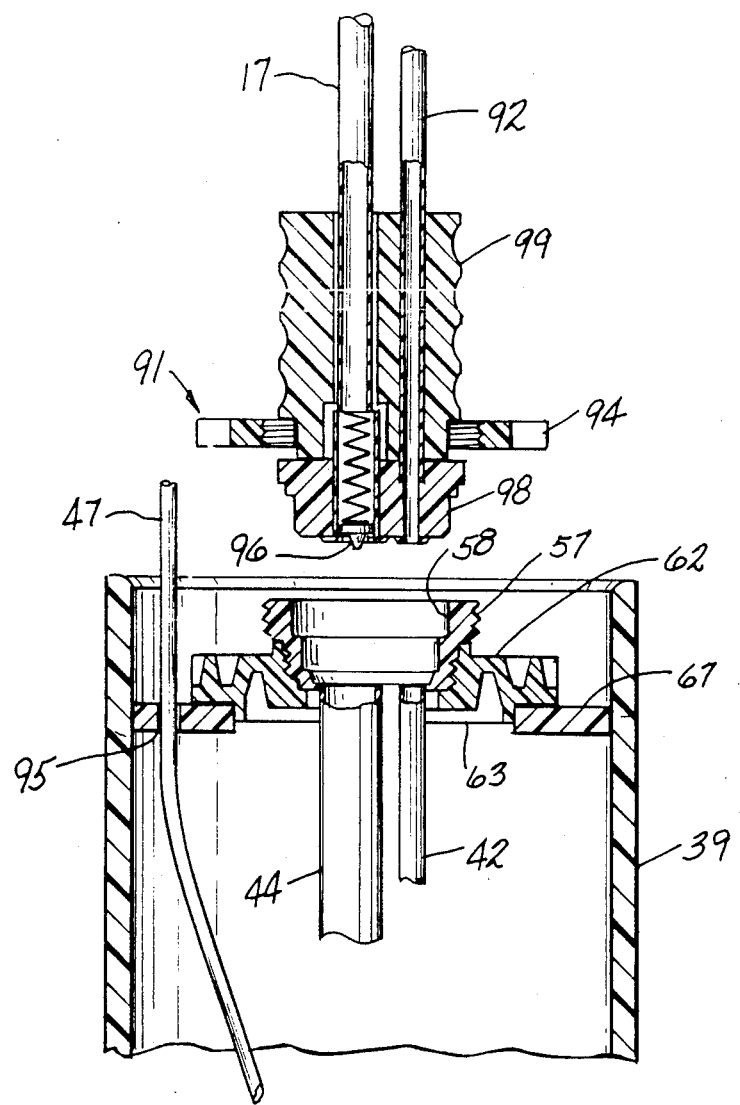
FIG. 8 is a partial side elevational view showing the quick disconnect apparatus and a portion of the bulk supply chemical container to which the apparatus is connected to supply dopant chemical to the bubbler ampule or working container.

The top of tank cap 39 has a contamination minimizing seal that includes a support fitting 63, a threaded receiving portion 62 and a closure cap 64 that is removable from coupling 58 after shipping for connection to the liquid dopant chemical infeed line 17 which feeds ampule or working container 18 in the controller 14. This connection is made through the quick disconnect apparatus, indicated generally by the numeral 91 in FIG. 8. Also, as seen in FIG. 8, the inert gas supply line 42 is connected via an appropriate connection in coupling 58 to the inert gas supply line 92 in the quick disconnect apparatus 91. Support fitting 63, receiving portion 62 and cap 64 in tank cap 39 are made of TEFLON ® PFA. Depth sensor wiring 47 has a suitable electrical coupling, such as a plug, that connects to the microprocessor 11 to provide warning when the liquid dopant chemical level in bulk supply tank 12 is low. Wiring 47 passes out the support fitting via a through hole 95 in shelf 67. Support fitting 63 snaps into place against shelf 67, which extends out from tank cap 39.

The quick disconnect assembly 91 of FIG. 8 is snap locked into place inside the threads 57 on coupling 58 and then secured by threading on nut portion 94, after closure cap 64 is removed. This makes the appropriate connections for inert gas supply line 42 to inert gas supply line 92 and liquid dopant chemical supply line 44 to the infeed line 17. Assembly 91 includes O-rings (not shown) and a spring loaded check valve 96 in base portion 98. Coupling 58 similarly employs O-rings. Support shroud 99 surrounds and supports lines 17 and 92.

Figure 4:
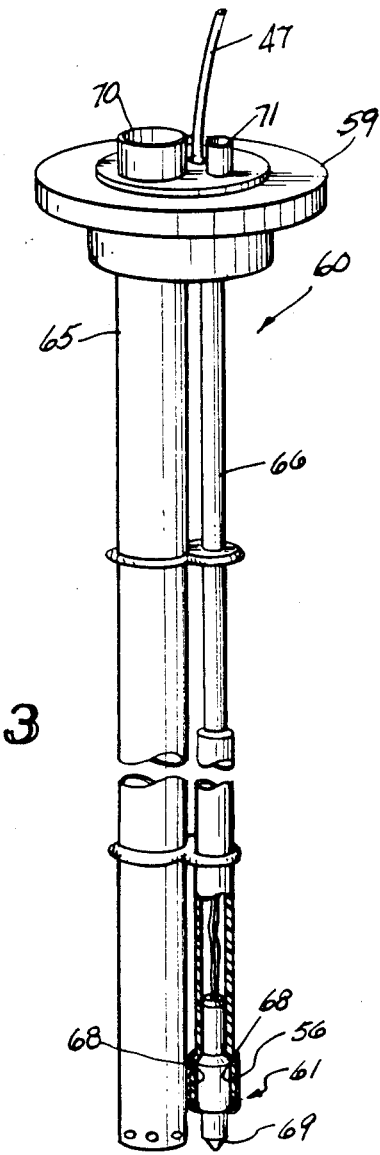
FIG. 4 is an enlarged side elevational view of the dip tube assembly that extends into the bulk container to sense the liquid dopant chemical level and to permit the outflow of replenishing liquid dopant chemical.

Dip tube assembly 60, seen in FIG. 4 has the liquid dopant chemical supply line 44 of FIG. 3 connected to the down tube 65 to allow the liquid dopant chemical to flow out of the supply container 12. The depth sensor means 61 is fitted and sealed within sensor tube 66. Sensor means 61 includes an appropriate block 68, such as aluminum, and a quartz prism 69. Shrink wrap material 56 seals the assembly 60 against moisture entering the tube 66. The sensor means 61 also has an appropriate light source and photoreceptor (both not shown) adjacent the prism 69 within the block 68 to sense the depth of the liquid dopant chemical in bulk supply chemical container 12. Depth sensor means 61 is available from Kinematics and Controls Corporation of New York, New York. The dip tube assembly 60 and bulk supply chemical container 12 are available from Fluoroware Corporation of Chaska, Minn.

FIG. 6 is a block diagram illustrating the logic circuitry path of information and responses through the automatic refill system 10. It is to be understood that although the following description will deal only with a single liquid dopant chemical temperature controller 14, the same automatic refill system 10 can be used with multiple liquid dopant chemical temperature controllers, for example four, being refilled from the same or additional bulk supply containers 12. At the center of the system is the microprocessor or programmable controller 11, which initially receives input from an input module 72 with signals representative of the liquid dopant chemical level from the ampule 18, the liquid level in the bulk supply chemical container 12 and the liquid dopant chemical temperature setpoint for the ampule 18 in controller 14. This information is fed into the input module 72 through a multiplexer 81 and strobe input lines 82. The temperature setpoint is set on the front panel of the housing containing the microprocessor or programmable controller 11 by digital push buttons. This information flows into bus 73 prior to entering the central processing unit or programmable controller 11.

Another input module 74 provides the analog input representative of the temperature of the chemical in the ampule 18 from the temperature sensing unit 23 of FIG. 2. This data is fed into it through strobe lines 4.

The output modules from the controller 11 include word or bit output module 75 which permits operator interface through the front panel of the housing containing the programmable controller 11 and an analog ouput module 76 for the signal representing the desired temperature setpoints that are set by the aforementioned digital push buttons for up to four temperature controllers 14 on the front panel of the housing containing the programmable controller 11. This data goes to the temperature controller 14. Output data from module 75 passes through a multiplexer unit 85 and strobe output lines 86.

Another output module 78 is used to respond to a signal from the programmable controller 11 to open or close the valves on the valve control manifold 15 from the bulk supply chemical container 12 to control the flow of replacement chemical to the ampule 18 and to permit operator interface with the contact input module 79 and the bit output module 75. Module 78 also controls the audio alarm and status lights on the front panel of the housing containing the programmable controller 11.

Where the automatic refill system 10 is utilized with multiple liquid dopant temperature controllers 14, contact input module 79 is used to indicate which temperature controllers 15 of a number, for example 4, are present and in use.

Modules 75, 78 and 79 have their inputs and outputs pass through a bus 80 enroute to and from the programmable controller 11.

Figure 7:
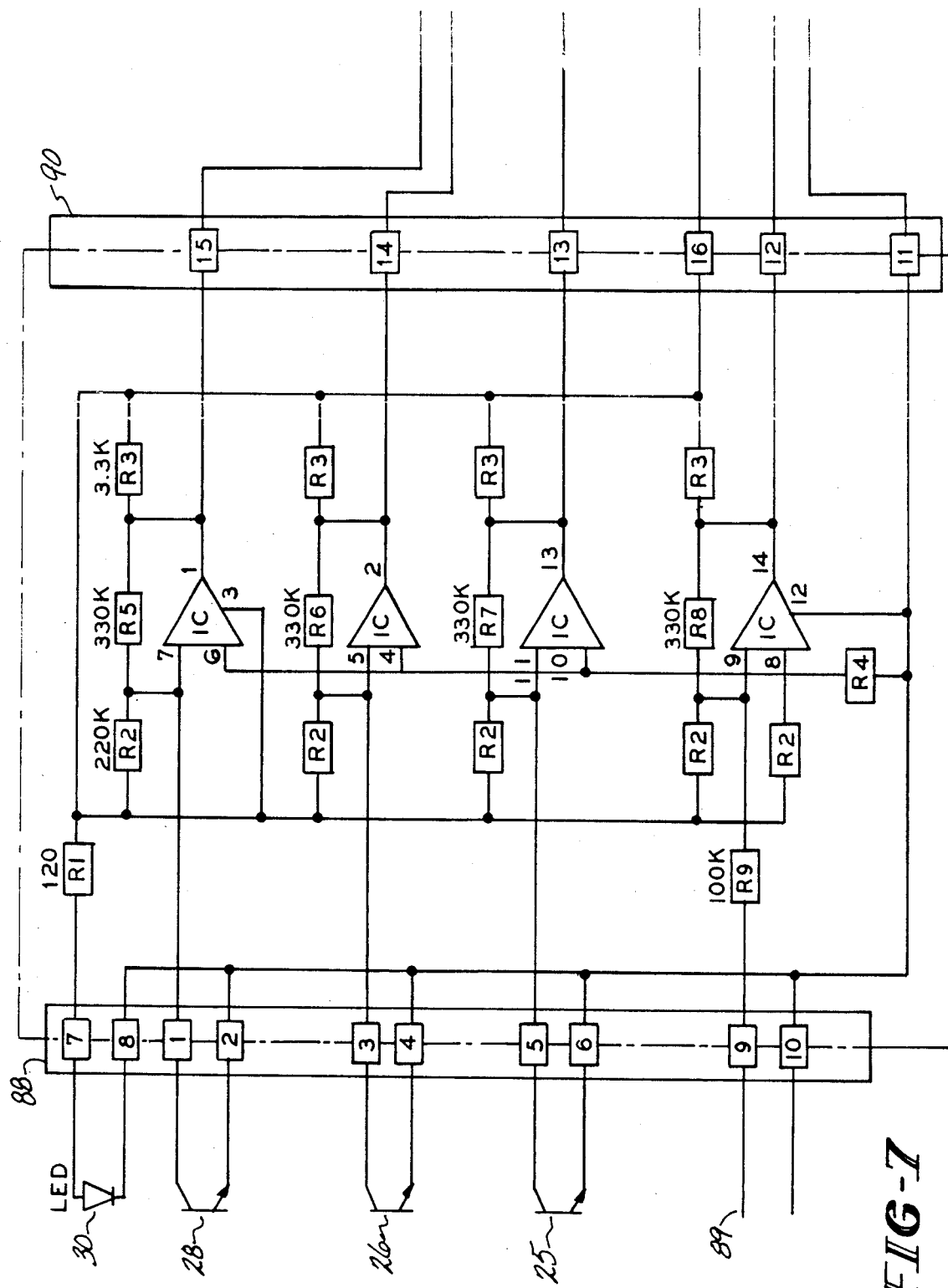
FIG. 7 is a circuit diagram of a preferred liquid level sensing circuit used to sense the liquid dopant chemical in the liquid dopant receiving ampule.

A representative equipment list necessary to operate the automatic refill system 10 is given below.
- Apache model 775 I/0 temperature controller internally modified for liquid level control and alarms with resistors and integrated circuits (LM 393 PC) and a 1500 cubic centimeter three-necked bubbler ampule
- MACE series 802 24 volt D.C., normally closed solenoid valves
- Fluoroware 20 liter PFA drum with level sensor
- Texas Instruments Series 500 model programmable controller and following related hardware
  - Model 500-5018 parallel word input
  - Model 500-5019 parallel word ouput
  - Model 500-5037 analog input
  - Model 500-5047 analog output
  - Model 500-5013 32 point low voltage D.C. ouput
  - Model 500-5008 24 volt D.C. contact
  - Model 500-2151 six slot base & power supply
  - Model 500-1102 CPU
- General Electric Infrared Emitter Model LED 55BF
- General Electric Model L14F2 photodarlington FIG. 7 shows a preferred operational amplifier circuit used to sense the liquid level in the ampule 18 and to transmit signals representative of that liquid level to the programmable controller 11. The light source 30 emits light that is detected, depending upon the liquid level in the ampule 18, by the photodarlington sensor means 25, 26 or 28. This information is transmitted to the appropriate pin connection on terminal board 88. If the level of liquid is at the low level of sensor means 29 of FIG. 2, the alarm circuit of temperature controller 14 sends a signal along data input line 89 that is fed into terminal board 88. Depending upon the signal sent, the input signals follow their appropriate circuit paths through resistors and operational amplifiers that together comprise the circuit which enhances the signal sent through module 72 to the programmable controller 11. The signals are consolidated in terminal board 90 in the temperature controller 14 and sent to the module 72.

In operation the automatic refill system 10 functions by having the sensor means 25, 26, 28 or 29 send a signal, based upon the detection of internally reflected or refracted light within ampule 18 according to the basic principles of Snell's Law. The signal is received from module 72 by the programmable controller 11, which in turn sends a signal to the actuator means or solenoid valve manifold 15 to open the appropriate solenoid valve to permit replenishing liquid dopant chemical from the bulk supply chemical container 12 flow to the ampule 18. When sensor means 20 senses the ampule 18 is full, a signal is sent that causes the programmable controller 11 to stop the flow of replenishing liquid dopant chemical from the container 12 by shutting the appropriate solenoid valve in manifold 15.

The liquid dopant chemical is kept at the desired temperature in ampule 18 by the input of the temperature setpoint from module 72 into the programmable controller 11 through output module 76. The temperature of the heating means and heat sink 55 is then adjusted within the liquid temperature controller 14. Signals representative of the actual temperature readings are sent back to the programmable controller 11 from the liquid temperature sensing unit 23 of FIG. 2 via input module 74. The temperature is also displayed on the front panel of the housing containing controller 11 via output module 75.

The depth of the chemical in the ampule 18 is closely monitored so that the ampule is continuously automatically refilled to avoid large volume, and the resulting temperature, fluctuations. In this manner a continuous supply of dopant chemical saturated gas is supplied to the diffusion furnace 16. If the temperature or liquid level sensings vary from the acceptable range, alarms are initiated via module 78. Similarly, the level of replacement liquid dopant chemical in the bulk supply chemical container 12 is monitored by the depth sensor means 61 and relayed to the programmable controller 11 by the input module 72 to signal when a replacement bulk supply chemical container 12 is necessary.

While the preferred structure in which the principles of the present invention have been incorporated is shown and described above, it is to be understood that the invention is not to be limited to the particular details thus presented, but in fact, widely different means may be employed in the practice of the broader aspects of the invention. For example, the low level sensor means could activate an automatic emergency fill cycle to automatically initiate an emergency filling of the ampule. Similarly, instead of using separate sensor means for the automatic fill start point and automatic fill stop point chemical level sensors, a single sensor could be used to accomplish both functions. It is to be understood, also, that the bulk supply chemical container could be stainless steel, as could the ampule within the liquid chemical temperature controller. In the latter case the liquid level sensor means could be inserted within the ampule.

The scope of the appended claims is intended to encompass all obvious changes in the details, materials, and arrangement of parts which will occur to one of skill in the art upon reading the disclosure.

What is claimed is:
1. An automatic refill system for refilling an ultra high purity liquid chemical in a working container from a bulk supply chemical container without removing the working container from its working apparatus, comprising in combination:
   (a) at least one working container for receiving retaining and dispensing the liquid chemical and having a bottom, a top and an intermediate surface connecting the bottom and the top, the container further having a gas-liquid interface below the top;

(b) a single housing corresponding to the at least one working container removably retaining the working container and having a liquid temperature visual display, liquid temperature set point means, heating means and alarm means for audially or visually signaling low liquid chemical level conditions;

(c) a bulk supply chemical container connected to the working container via a flow conduit for refilling the working container with the liquid chemical;

(d) level sensor means cooperative with the working container to sense the level of chemical and to control the refill of the working container with the chemical, the sensor means sensing an automatic fill start point chemical level and an automatic fill stop point chemical level;

(e) transmission means to transmit the sensed level of the chemical;

(f) control means to receive the sensed level of chemical from the transmission means and transmit an output signal in response to the received sensed level;

(g) actuator means connected to the control means and the flow conduit, the actuator means being responsive to the output signals of the control means to permit flow from the bulk supply chemical container when the automatic fill start point chemical level sensing has been received and to stop the flow from the bulk supply chemical container when the automatic fill stop point chemical level sensing has been received;

(h) a refill tube in the working container connected to the flow conduit to deliver the chemical from the bulk supply container to the working container adjacent the bottom to not disturb the gas-liquid interface during refill;

(i) temperature sensing means to sense the temperature of the liquid chemical in the working container, the temperature sensing means being connected to a visual display in the housing; and (j) second level sensor means for sensing the level of liquid in the bulk supply chemical container connected to the control means to transmit the sensings thereto.

2. The apparatus according to claim 1 wherein the temperature sensing means sensing the temperature of the liquid chemical in the working container is a thermowell.

3. The apparatus according to claim 2 wherein the level sensor means for the bulk supply chemical container is a quartz prism connected to a light source and a photoreceptor.

4. The apparatus according to claim 3 wherein the level sensor means for the bulk supply chemical container is sealed to prevent chemical leakage around the quartz prism and to prevent corrosion affecting connections to the control means.

5. The apparatus according to claim 4 wherein the bulk supply chemical container is pressurized with an inert gas that is fed into the bulk supply chemical container through a gas inlet tube.

6. The apparatus according to claim 5 wherein the bulk supply chemical container has the chemical flow out through a chemical outlet tube connected by the flow conduit to the actuator means.

7. The apparatus according to claim 6 wherein the gas inlet tube, the chemical outlet tube and the level sensor means connections are connected to a sealable quick disconnect apparatus.

8. The apparatus according to claim 7 wherein the bulk supply chemical container at least is lined with polytetrafluoroethylene.

9. The apparatus according to claim 1 wherein the level sensor means cooperative with the working container further comprises a chemical level overfill automatic shutdown point.

10. The apparatus according to claim 9 wherein the level sensor means cooperative with the working container further comprises an automatic emergency fill point.

11. The apparatus according to claim 9 wherein the level sensor means further comprise light emitting diodes and photoreceptors.

12. The apparatus according to claim 11 wherein the actuator means is a solenoid valve.

13. The apparatus according to claim 1 wherein the level sensor means sensing the automatic fill start point chemical level and the automatic fill stop point chemical level are spaced apart a sufficiently small distance that the automatic refill with the chemical does not substantially change the degree of saturation of the gas by the chemical or substantially upset the temperature of the chemical in the working container.

14. The apparatus according to claim 13 wherein the working container has a temperature sensor means connected to the control means and extending through the top and down into the chemical to sense the temperature of the chemical.

15. The apparatus according to claim 1 wherein the working container is a bubbler ampule in a liquid dopant temperature controller.

16. The apparatus according to claim 15 wherein the control means can control the automatic refilling of 4 bubbler ampules simultaneously.

* * * * *